United States Patent
Lee et al.

(10) Patent No.: US 11,119,398 B2
(45) Date of Patent: Sep. 14, 2021

(54) EUV PHOTO MASKS

(71) Applicant: TAIWAN SEMICONDUCTOR MANUFACTURING CO., LTD., Hsinchu (TW)

(72) Inventors: Hsin-Chang Lee, Zhubei (TW); Pei-Cheng Hsu, Taipei (TW); Ping-Hsun Lin, New Taipei (TW); Ta-Cheng Lien, Cyonglin Township (TW); Tzu Yi Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 161 days.

(21) Appl. No.: 16/383,570

(22) Filed: Apr. 12, 2019

(65) Prior Publication Data
US 2020/0103743 A1 Apr. 2, 2020

Related U.S. Application Data

(60) Provisional application No. 62/738,769, filed on Sep. 28, 2018.

(51) Int. Cl.
*G03F 1/22* (2012.01)
*H01L 21/027* (2006.01)

(52) U.S. Cl.
CPC ............ *G03F 1/22* (2013.01); *H01L 21/0274* (2013.01)

(58) Field of Classification Search
CPC ... G03F 1/22; G03F 1/24; G03F 7/707; G03F 1/38; G03F 7/70708
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |

(Continued)

FOREIGN PATENT DOCUMENTS

| | | | | |
|---|---|---|---|---|
| KR | 20170021191 A | * | 2/2017 | |
| WO | WO-2017090485 A1 | * | 6/2017 | ............... G03F 1/48 |

OTHER PUBLICATIONS

English Machine Translation of WO 2017/090485 A1 (Year: 2017).*

(Continued)

*Primary Examiner* — John A McPherson
*Assistant Examiner* — Nicholas E Brown
(74) *Attorney, Agent, or Firm* — McDermott Will & Emery LLP

(57) ABSTRACT

A photo mask for extreme ultra violet (EUV) lithography includes a substrate having a front surface and a back surface opposite to the front surface, a multilayer Mo/Si stack disposed on the front surface of the substrate, a capping layer disposed on the multilayer Mo/Si stack, an absorber layer disposed on the capping layer, and a backside conductive layer disposed on the back surface of the substrate. The backside conductive layer is made of tantalum boride.

20 Claims, 11 Drawing Sheets

(56) References Cited

U.S. PATENT DOCUMENTS

| | | | |
|---|---|---|---|
| 2007/0160916 A1* | 7/2007 | Ikuta | B82Y 10/00 |
| | | | 430/5 |
| 2009/0253055 A1* | 10/2009 | Hayashi | B82Y 40/00 |
| | | | 430/5 |
| 2016/0357100 A1* | 12/2016 | Ikuta | G03F 1/24 |

OTHER PUBLICATIONS

English Machine Translation of KR 2017/0021191 A (Year: 2017).*
Kazuya Ota, Masami Yonekawa, Mitsuaki Amemiya, Takao Taguchi, and Osamu Suga "Evaluation results of a new EUV reticle pod having reticle grounding paths", Apr. 8, 2011, Proc. SPIE 7969, Extreme Ultraviolet (EUV) Lithography II, 79691V (Year: 2011).*

* cited by examiner

EUV PHOTO MASKS

CROSS-REFERENCE TO RELATED APPLICATIONS

This application claims priority to U.S. Provisional Patent Application 62/738,769, filed Sep. 28, 2018, the entire disclosure of which is incorporated herein by reference.

BACKGROUND

Photolithography operations are one of the key operations in the semiconductor manufacturing process. Photolithography techniques include ultraviolet lithography, deep ultraviolet lithography, and extreme ultraviolet lithography (EUVL). The photomask is an important component in photolithography operations. It is critical to fabricate EUV photomasks free of defects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E, 2F and 2G schematically illustrate a method of fabricating an EUV photomask according to an embodiment of the present disclosure.

DETAILED DESCRIPTION

Figure 1B:
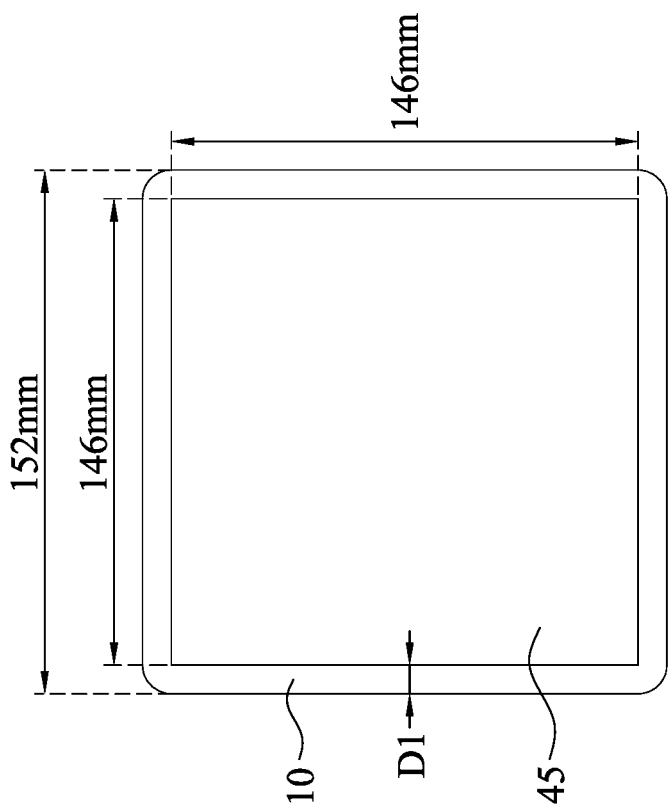
FIGS. 1A and 1B show a EUV photo mask blank according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments of the present disclosure provide a method of manufacturing an EUV photo mask. More specifically, the present disclosure provides techniques to prevent or suppress damage on backside conductive layer of an EUV photo mask.

EUV lithography (EUVL) employs scanners using light in the extreme ultraviolet (EUV) region, having a wavelength of about 1 nm to about 100 nm, for example, 13.5 nm. The mask is a critical component of an EUVL system. Because the optical materials are not transparent to EUV radiation, EUV photo masks are reflective masks. EUV photo masks require very low surface roughness and must have no resolvable defects.

An EUV photo mask with circuit patterns for EUV lithography requires various etching operations, such as plasma dry etching. An EUV photo mask to be etched is placed on a mask stage in a plasma etching chamber. In some embodiments, the mask stage includes an electric chuck mechanism to hold the EUV photo mask during the plasma etching. An EUV photo mask includes a backside conductive layer to the electric chuck mechanism. However, when a large gap exists between the EUV photo mask and the stage, active species of the plasma may diffuse to the bottom portion of the EUV photo mask, causing damage on the backside conductive layer of the EUV photo mask. Damage on the backside conductive layer may cause various problems, such as generation of particles and/or tree-like erosion at the edge of the conductive film. These particles and/or defects in the backside conductive layer may cause insufficient chucking and/or defects on the circuit patterns on the front side of the EUV photo mask.

The present disclosure provides techniques to prevent or suppress damage on the backside conductive layer of an EUV photo mask caused by active species of the plasma during plasma etching.

Figure 1A:
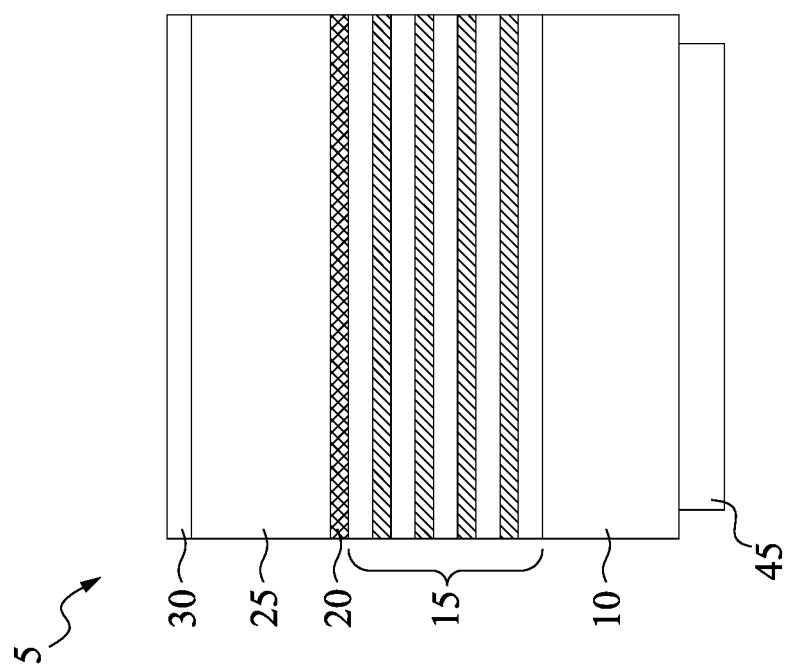

FIGS. 1A and 1B show an EUV photo mask blank according to an embodiment of the present disclosure. FIG. 1A is a cross sectional view and FIG. 1B is a plan view viewed from the backside of the EUV photo mask.

In some embodiments, the EUV photomask with circuit patterns is formed from a EUV photo mask blank 5. The EUV photo mask blank 5 includes a substrate 10, a multi-layer Mo/Si stack 15 of multiple alternating layers of silicon and molybdenum, a capping layer 20, an absorber layer 25 and a hard mask layer 30. Further, a backside conductive layer 45 is formed on the backside of the substrate 10, as shown in FIG. 1A.

The substrate 10 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near-infrared), and a portion of the ultraviolet wavelengths. In some embodiments, the low thermal expansion glass substrate absorbs extreme ultraviolet wavelengths and deep ultraviolet wavelengths near the extreme ultraviolet. In some embodiments, the size of the substrate 10 is 152 mm×152 mm having a thickness about 20 mm.

In some embodiments, the Mo/Si multilayer stack 15 includes from about 30 alternating layers each of silicon and molybdenum to about 60 alternating layers each of silicon and molybdenum. In certain embodiments, from about 40 to about 50 alternating layers each of silicon and molybdenum are formed. In some embodiments, the reflectivity is higher than about 70% for wavelengths of interest e.g., 13.5 nm. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each layer of silicon and molybdenum is about 3 nm to about 4 nm.

In other embodiments, the multilayer stack 15 includes alternating molybdenum layers and beryllium layers. In some embodiments, the number of layers in the multilayer stack 15 is in a range from about 20 to about 100 although any number of layers is allowed as long as sufficient reflectivity is maintained for imaging the target substrate. In some embodiments, the reflectivity is higher than about 70% for wavelengths of interest e.g., 13.5 nm. In some embodiments, the multilayer stack 15 includes about 30 to about 60 alternating layers of Mo and Be. In other embodiments of the present disclosure, the multilayer stack 15 includes about 40 to about 50 alternating layers each of Mo and Be.

The capping layer 20 is disposed over the Mo/Si multilayer 15 to prevent oxidation of the multilayer stack 15 in some embodiments. In some embodiments, the capping layer 20 is made of ruthenium having a thickness of from about 2 nm to about 10 nm. In certain embodiments, the thickness of the capping layer 20 is from about 2 nm to about 4 nm. In some embodiments, the capping layer 20 is formed by chemical vapor deposition, plasma-enhanced chemical vapor deposition, atomic layer deposition, physical vapor deposition, or any other suitable film forming method. In other embodiments, a Si layer is used as the capping layer 20.

The absorber layer 25 is disposed over the capping layer 20. In some embodiments, the absorber layer 25 is Ta-based material. In some embodiments, the absorber layer 25 is made of TaN, TaO, or TaBN having a thickness from about 25 nm to about 100 nm. In certain embodiments, the absorber layer 25 thickness ranges from about 50 nm to about 75 nm. In some embodiments, the absorber layer 25 is formed by chemical vapor deposition, plasma-enhanced chemical vapor deposition, atomic layer deposition, physical vapor deposition, or any other suitable film forming method.

In some embodiments, an antireflective layer (not shown) is optionally disposed over the absorber layer 25. The antireflective layer is made of a silicon oxide in some embodiments, and has a thickness of from about 2 nm to about 10 nm. In other embodiments, a TaBO layer having a thickness in a range from about 12 nm to about 18 nm is used as the antireflective layer. In some embodiments, the thickness of the antireflective layer is from about 3 nm to about 6 nm. In some embodiments, the antireflective layer is formed by chemical vapor deposition, plasma-enhanced chemical vapor deposition, atomic layer deposition, physical vapor deposition, or any other suitable film forming method.

The hard mask layer 30 is disposed over the absorbing layer 25 in some embodiments. The hard mask layer 30 is formed over the antireflective layer in some embodiments. In some embodiments, the hard mask layer 30 is made of silicon, a silicon-based compound, chromium, or a chromium-based compound having a thickness of about 4 nm to about 20 nm. In some embodiments, the chromium-based compound includes CrON, chromium oxide and/or chromium nitride. In some embodiments, the hard mask layer 30 is formed by chemical vapor deposition, plasma-enhanced chemical vapor deposition, atomic layer deposition, physical vapor deposition, or any other suitable film forming method. In other embodiments, TaO, TaN, Ru, RuB, RuB, TaB, TaBN or TaBO is used as the hard mask layer 30.

In some embodiments, the backside conductive layer 45 is disposed on a second main surface of the substrate 10 opposing the first main surface of the substrate 10 on which the Mo/Si multilayer 15 is formed. In some embodiments, the backside conductive layer 45 is made of TaB (tantalum boride) or other Ta based conductive material.

Currently, a Cr based conductive material (CrN or CrON) has been used for the backside conductive layer. Compared with the Cr based conductive material, TaB has lower sheet resistance (higher conductivity) and a flatter surface, while TaB has sufficient stiffness similar to CrN. In some embodiments, sheet resistance of the backside conductive layer 45 is equal to or smaller than $20\Omega/\square$. In certain embodiments, the sheet resistance of the backside conductive layer 45 is equal to or more than $0.1\Omega/\square$. In some embodiments, surface roughness Ra of the backside conductive layer 45 is equal to or smaller than 0.25 nm. In certain embodiments, the surface roughness Ra of the backside conductive layer 45 is equal to or more than 0.05 nm. Further, in some embodiments, flatness of the backside conductive layer 45 is equal to or less than 50 nm (within the EUV photo mask). In some embodiments, the flatness of the backside conductive layer 45 is more than 1 nm.

In some embodiments, the tantalum boride is crystal. The crystalline tantalum boride includes TaB, $Ta_5B_6$, $Ta_3B_4$ and $TaB_2$. In certain embodiments, the backside conductive layer 45 is TaB crystal. In other embodiments, the tantalum bodied is poly crystal or amorphous.

A thickness of the backside conductive layer is in a range from about 50 nm to about 400 nm in some embodiments. In other embodiments, the backside conductive layer 45 has a thickness of about 50 nm to about 100 nm. In certain embodiments, the thickness is in a range from about 65 nm to about 75 nm.

In some embodiments, the backside conductive layer 45 is formed by atmospheric chemical vapor deposition (CVD), low pressure CVD, plasma-enhanced CVD, laser-enhanced CVD, atomic layer deposition (ALD), molecular beam epitaxy (MBE), physical vapor deposition including thermal deposition, pulsed laser deposition, electron-beam evaporation, ion beam assisted evaporation and sputtering, or any other suitable film forming method. In cases of CVD, source gases include $TaCl_5$ and $BCl_3$ in some embodiments.

In some embodiments, the area of the backside conductive layer 45 is smaller than the area of the substrate, and a circumference portion of the second main surface of the substrate 10 is exposed (not covered by the backside conductive layer 45) as shown in FIG. 1B. When the substrate 10 is a 6-inch substrate, i.e., 152 mm×152 mm, the size of the backside conductive layer 45 is greater than 142 mm×142 mm and smaller than 150 mm×150 mm in some embodiments. In other embodiments, the size of the backside conductive layer 45 is greater than 144 mm×144 mm and smaller than 148 mm×148 mm. The shape of the backside conductive layer 45 is square or rectangular in some embodiments. When the shape of the backside conductive layer 45 has a first side LX and a second side LY in a crossing direction (e.g., perpendicular), 0.98≤LX/LY≤1.02 in some embodiments. In some embodiments, 142 mm<LX<150 mm and 142 mm<LY<150 mm, and in other embodiments, 144 mm<LX<148 mm and 144 mm<LY<148 mm. In some embodiments, the ratio of the side LX or Ly of the backside conductive layer 45 to one side of the substrate 10 is from about 0.93 to about 0.99.

In some embodiments, a distance D1 from the edge of the substrate 10 to the edge of the backside conductive layer 45 at the center of the edges is in a range from about 1 mm to about 5 mm, and is in a range from about 2 mm to about 4 mm in other embodiments. In some embodiments, corners of the backside conductive layer 45 are cut to form an octagonal shape. As explained below, the backside conductive layer 45 is to be in contact with burls of an electric chucking mechanism. In other embodiments, the EUV photo mask is merely placed on the cathode of the mask stage. In some embodiments, the maximum area of the burl arrangement is about 142 mm×142 mm, and thus the size of the backside conductive layer 45 is greater than 142 mm×142 mm.

In other embodiments, different size substrates are used. When the substrate 10 is a 5-inch substrate, i.e., 126.6 mm×126.6 mm, the size of the backside conductive layer 45 is greater than 120 mm×120 mm and smaller than 125 mm×125 mm in some embodiments, and is greater than 122 mm×122 mm and smaller than 123.5 mm×123.5 mm in other embodiments. When the substrate 10 is a 7-inch substrate, i.e., 177.4 mm×177.4 mm, the size of the backside conductive layer 45 is greater than 170 mm×170 mm and smaller than 175 mm×175 mm in some embodiments, and is greater than 172 mm×172 mm and smaller than 173.5 mm×173.5 mm in other embodiments.

In some embodiments, the TaB backside conductive layer 45 is formed on an entire bask surface of the substrate 10, and the edge portion of the backside conductive layer 45 is removed to partially expose the back surface of the substrate 10. The back side conductive layer 45 is removed by using one or more lithography and etching operations. In other embodiments, the edge portion of the back surface of the substrate 10 is covered by, for example, a hard cover having an opening, and sputtered materials for TaB are deposited on the back surface of the substrate 10 through the opening of the hard cover.

FIGS. 2A-2G schematically illustrate a method of fabricating an EUV photomask 5 for use in extreme ultraviolet lithography (EUVL). It is understood that additional operations can be provided before, during, and after processes shown by FIGS. 2A-2G, and some of the operations described below can be replaced or eliminated, for additional embodiments of the method. The order of the operations/processes may be interchangeable.

In the fabrication of an EUV photo mask 5, a first photoresist layer 35 is formed over the hard mask layer 30 of the EUV photo mask blank, and the photoresist layer 35 is selectively exposed to actinic radiation. Before the first photoresist layer 35 is formed, the EUV photo mask blank is subject to inspection. The selectively exposed first photoresist layer 35 is developed to form a pattern 40 in the first photoresist layer 35. In some embodiments, the actinic radiation is an electron beam or an ion beam. In some embodiments, the pattern 40 corresponds to a pattern of semiconductor device features for which the EUV photo mask 5 will be used to form in subsequent operations.

Figure 2B:
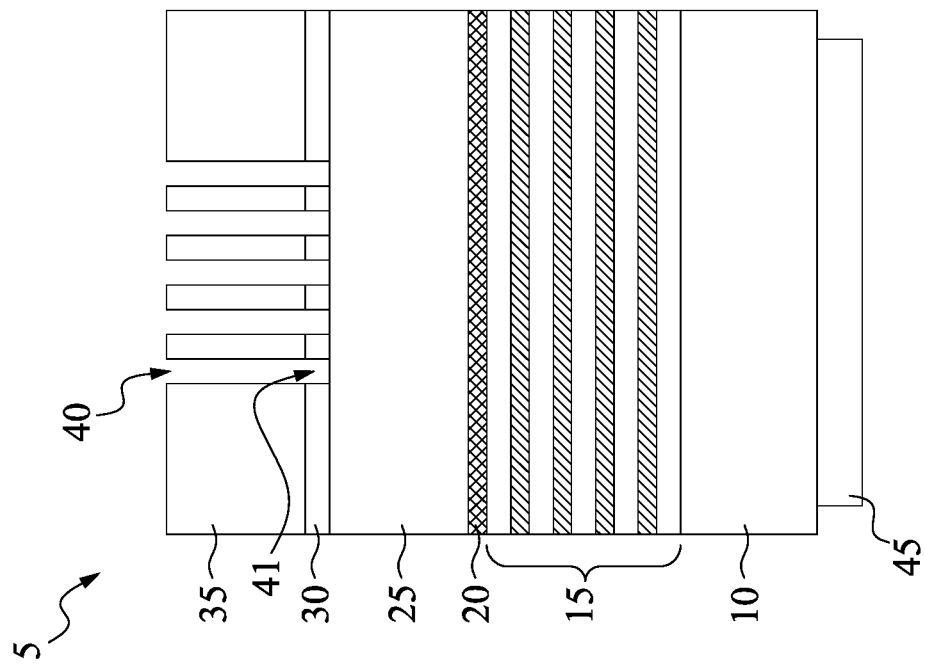
Figure 2A:
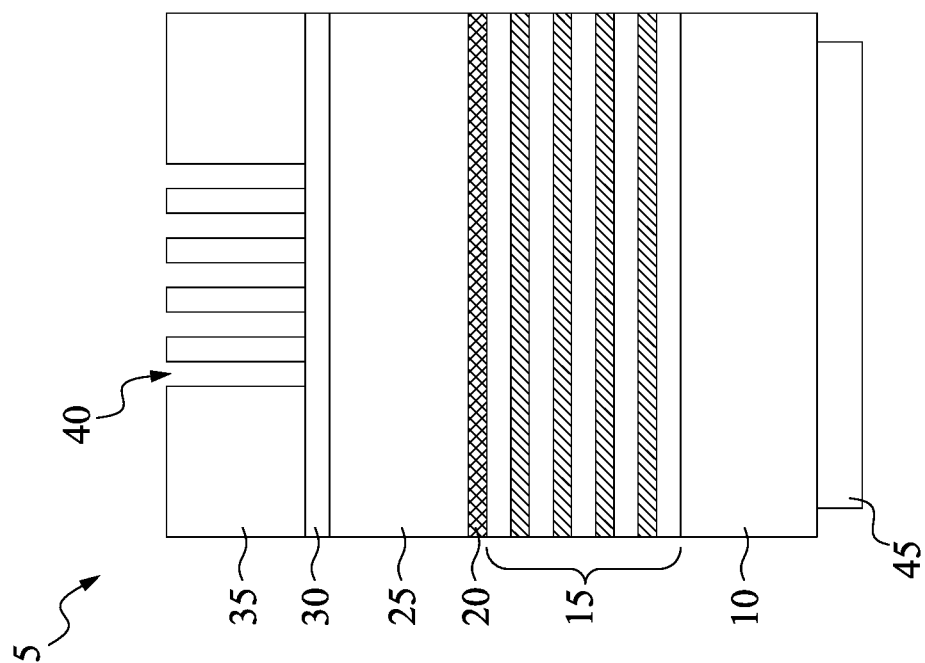
Figure 2C:
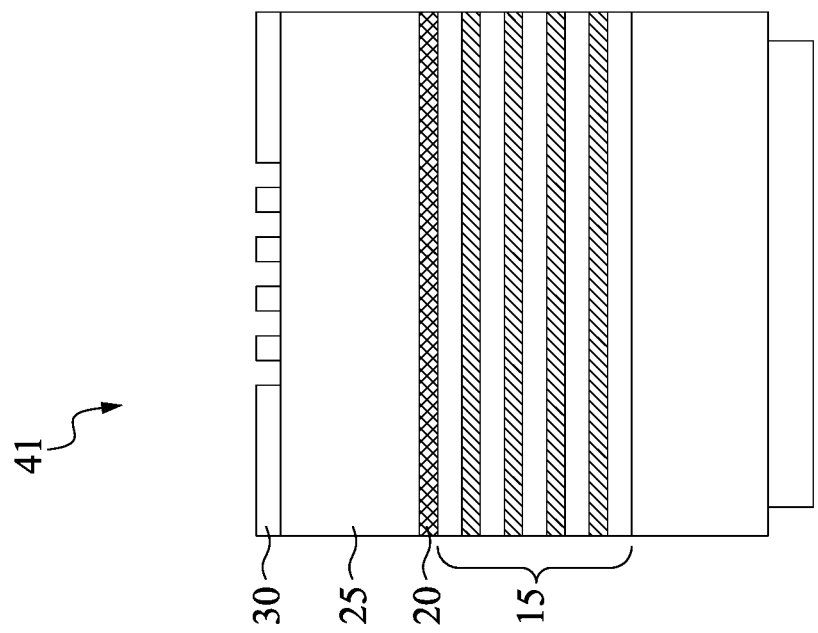

Next, the pattern 40 in the first photoresist layer 35 is extended into the hard mask layer 30 forming a pattern 41 in the hard mask layer 30 exposing portions of the absorber layer 25, as shown in FIG. 2B. The pattern 41 extended into the hard mask layer 30 is formed by etching, in some embodiments, using a suitable wet or dry etchant that is selective to the hard mask layer 30. After the pattern 41 by the hard mask layer 30 is formed, the first photoresist layer 35 is removed by photoresist stripper to expose the upper surface of the hard mask layer 30, as shown in FIG. 2C.

Figure 2D:
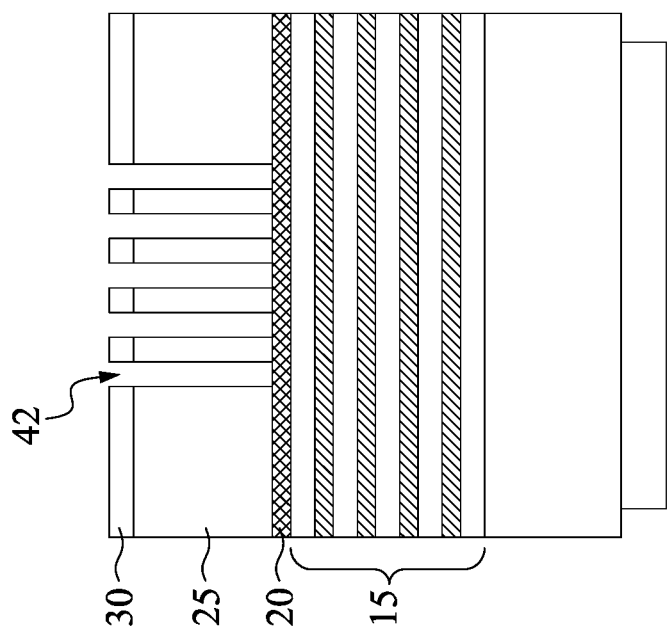

Then, the pattern 41 in the hard mask layer 30 is extended into the absorber layer 25 forming a pattern 42 in the absorber layer 25 exposing portions of the capping layer 20, as shown in FIG. 2D. The pattern 42 extended into the absorber layer 25 is formed by etching, in some embodiments, using a suitable wet or dry etchant that is selective to the absorber layer 25. In some embodiments, plasma dry etching is used.

As shown in FIG. 2E, a second photoresist layer 45 is formed over the absorber layer 25 filling the pattern 42 in the absorber layer 25. The second photoresist layer 45 is selectively exposed to actinic radiation such as electron beam or UV radiation. The selectively exposed second photoresist layer 45 is developed to form a pattern 50 in the second photoresist layer 45. The pattern 50 corresponds to a black border surrounding the circuit patterns. A black border is a frame shape area created by removing all the multilayers on the EUV photo mask in the region around a circuit pattern area. It is created to prevent exposure of adjacent fields when printing an EUV photo mask on a wafer. The width of the black border is in a range from about 1 mm to about 5 mm in some embodiments.

Figure 2F:
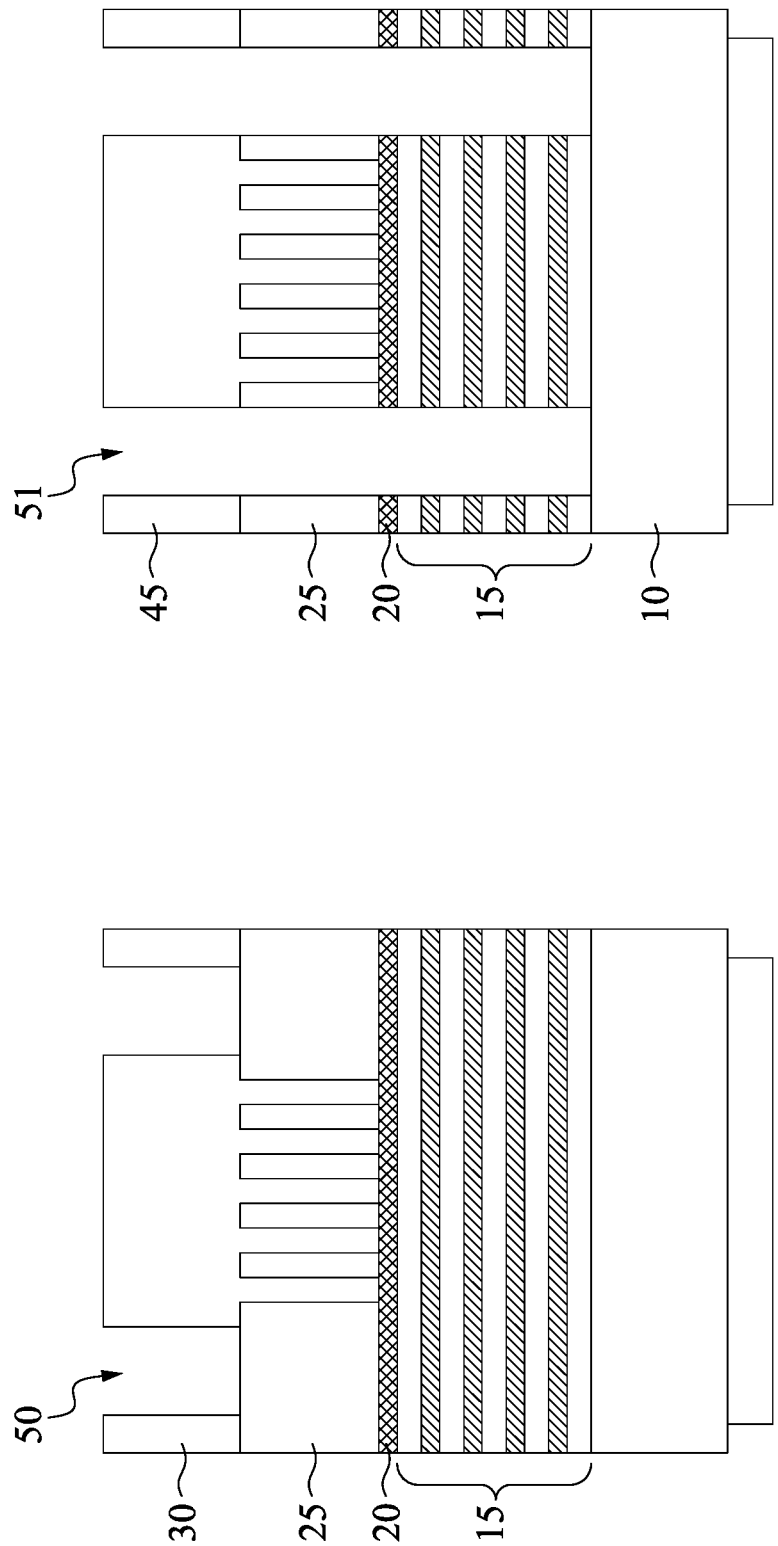

Next, the pattern 50 in the second photoresist layer 45 is extended into the absorber layer 25, capping layer 20, and Mo/Si multilayer 15 forming a pattern 51 in the absorber layer 25, capping layer 20, and Mo/Si multilayer 15 exposing portions of the substrate 10, as shown in FIG. 2F. The pattern 51 is formed by etching, in some embodiments, using one or more suitable wet or dry etchants that are selective to each of the layers that are etched. In some embodiments, plasma dry etching is used.

Figure 2G:
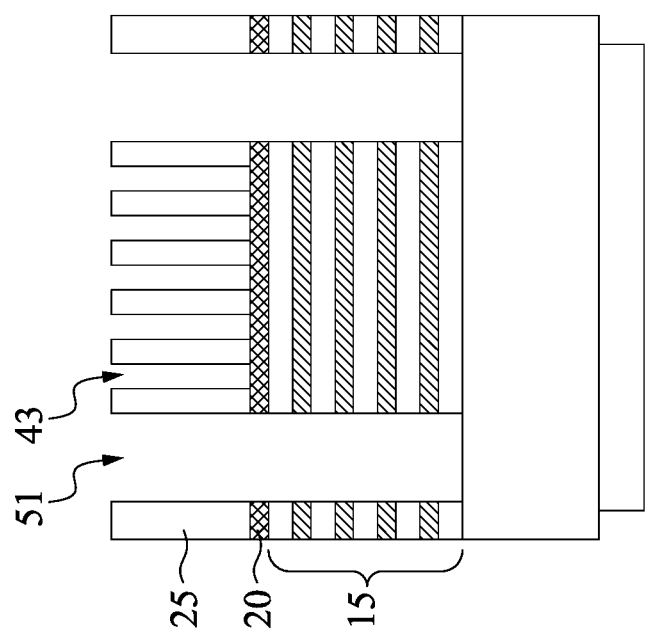

Then, the second photoresist layer 45 is removed by a suitable photoresist stripper to expose the upper surface of the absorber layer 25. The pattern 51 in the absorber layer 25, capping layer 20, and the Mo/Si multilayer 15 defines a black border of the photomask 5 in some embodiments of the disclosure, as shown in FIG. 2G. After removal of the second photoresist layer, the photomask 5 undergoes a cleaning operation, inspection, and the photomask 5 is repaired as necessary, to provide a finished photomask 5.

As set forth, there are various etching (plasma etching) operations in fabricating an EUV photo mask.

Figure 3:
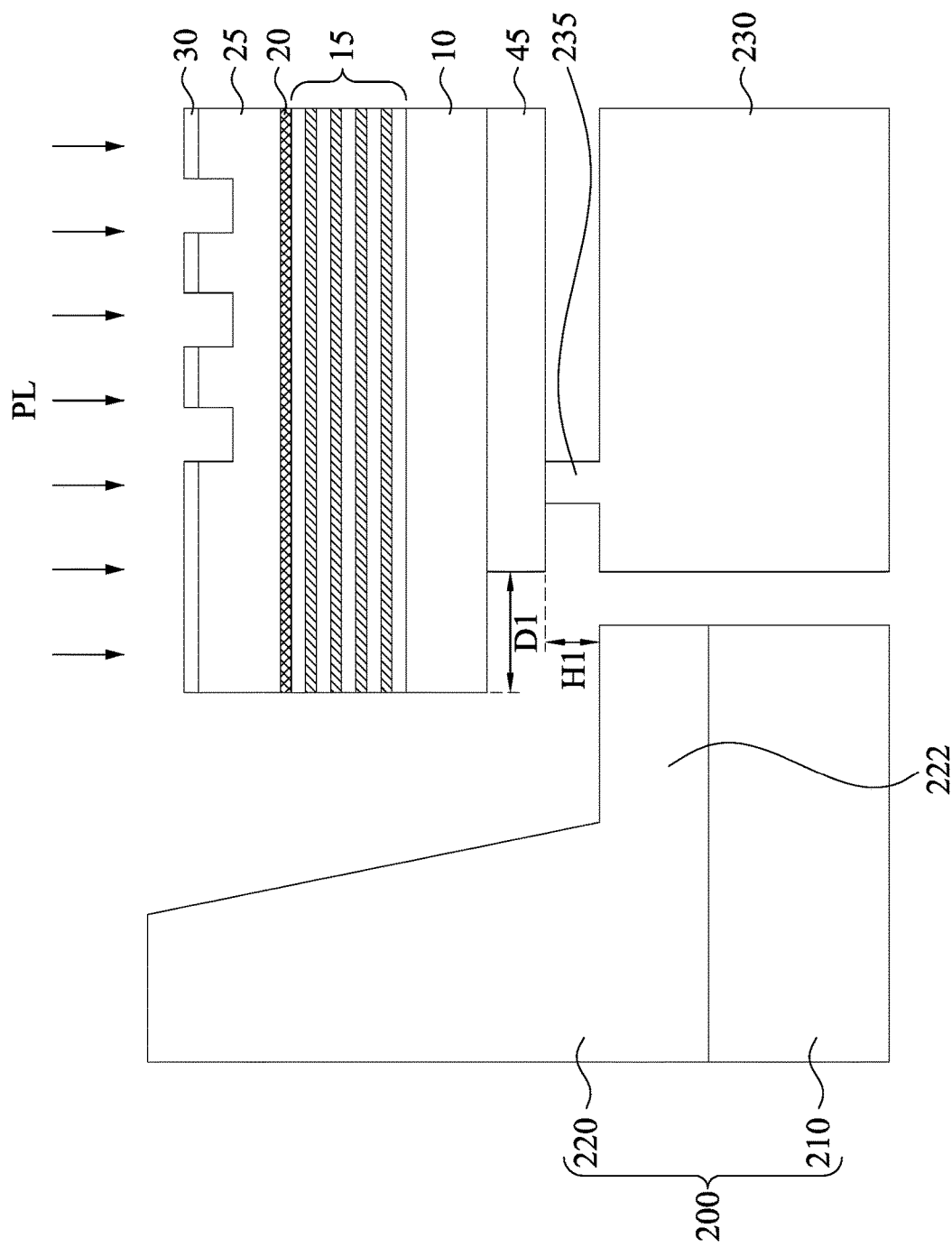
FIG. 3 shows a schematic view of an etching operation of an EUV photo mask according to one embodiment of the present disclosure.

FIG. 3 shows a schematic view of an etching operation of an EUV photo mask according to one embodiment of the present disclosure.

In some embodiments, a stage 200 of an etching apparatus includes a capture ring 220 which is supported by a pedestal 210. Further, the etching apparatus includes an electric chuck mechanism including a cathode 230 having burls 235 to hold an EUV photo mask, in some embodiments. The stage 200, the pedestal 210 and the cathode 230 are disposed inside a plasma etching chamber.

When the EUV photo mask 5 is transferred to the etching chamber, the EUV photo mask 5 is place on burls 235, which are arranged in a matrix in plan view, of the cathode 230. FIG. 3 shows the state when the EUV photo mask 5 is place on burls 235. A distance H1 between the level of bottom of the backside conductive layer 45 and the upper surface of a flat portion 222 of the capture ring 220 is in a range from about 0.5 mm to 1.5 mm in some embodiments. Since the distance D1 from the edge of the substrate 10 to the edge of the backside conductive layer 45 is set long (e.g., in a range from about 1 mm to about 5 mm or in a range from about 2 mm to about 4 mm), the active species of the plasma PL do not reach the backside conductive layer 45. In some embodiments, when the distance D1 is equal to or more than 3 mm, the backside conductive layer 45 is substantially free from damage by the active species of the plasma.

Figure 4:
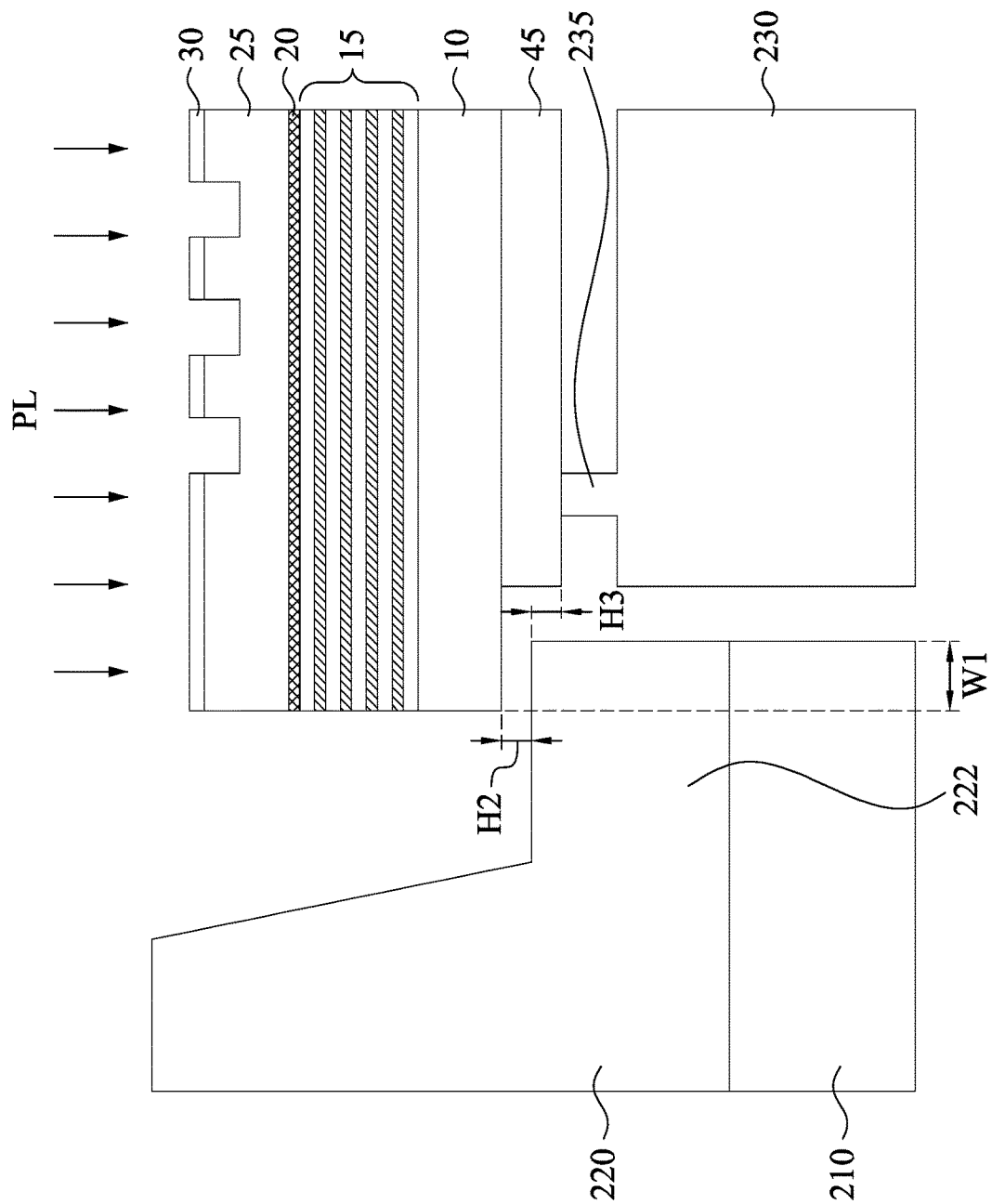
FIG. 4 shows a schematic view of an etching operation of an EUV photo mask according to another embodiment of the present disclosure.

FIG. 4 shows a schematic view of an etching operation of an EUV photo mask according to one embodiment of the present disclosure.

In this embodiment, the stage 200 and/or the cathode 230 of the electric chuck mechanism are configured such that when an EUV photo mask 5 is placed on the burls 235 of the cathode 230 of the electric chuck mechanism, the level of the bottom of the backside conductive layer 45 is located below the upper surface of the flat portion 222 of the stage 200. In some embodiments, a difference H1 in height between the flat portion 222 and the bottom of the substrate 10 is in a range from about 0 nm (contacting) to about 100 nm. According to this configuration, it is possible to prevent active species of plasma PL from entering the back portion of the EUV photo mask 5 during the plasma etching. Thus, it is possible to prevent damage on the backside conductive layer 45. In some embodiments, the level of the bottom of the backside conductive layer 45 is lower than the upper surface flat portion 222 of the stage 200 by a height H3 as shown in FIG. 4. In some embodiments, the height H3 is in a range from about 0 nm (coplanar) to about 100 nm and in other embodiments, H3 is in a range from about 10 nm to about 50 nm. In some embodiments, the flat portion 222 of the capturing ring 220 extends below the substrate 10 such that the flat portion 222 overlaps the EUV photo mask 5 by a width W1. In some embodiments, the width W1 is in a range from about 0 nm (nonoverlapping) to about 50 nm and in other embodiments, W1 is in a range from about 10 nm to about 30 nm.

Figure 5:
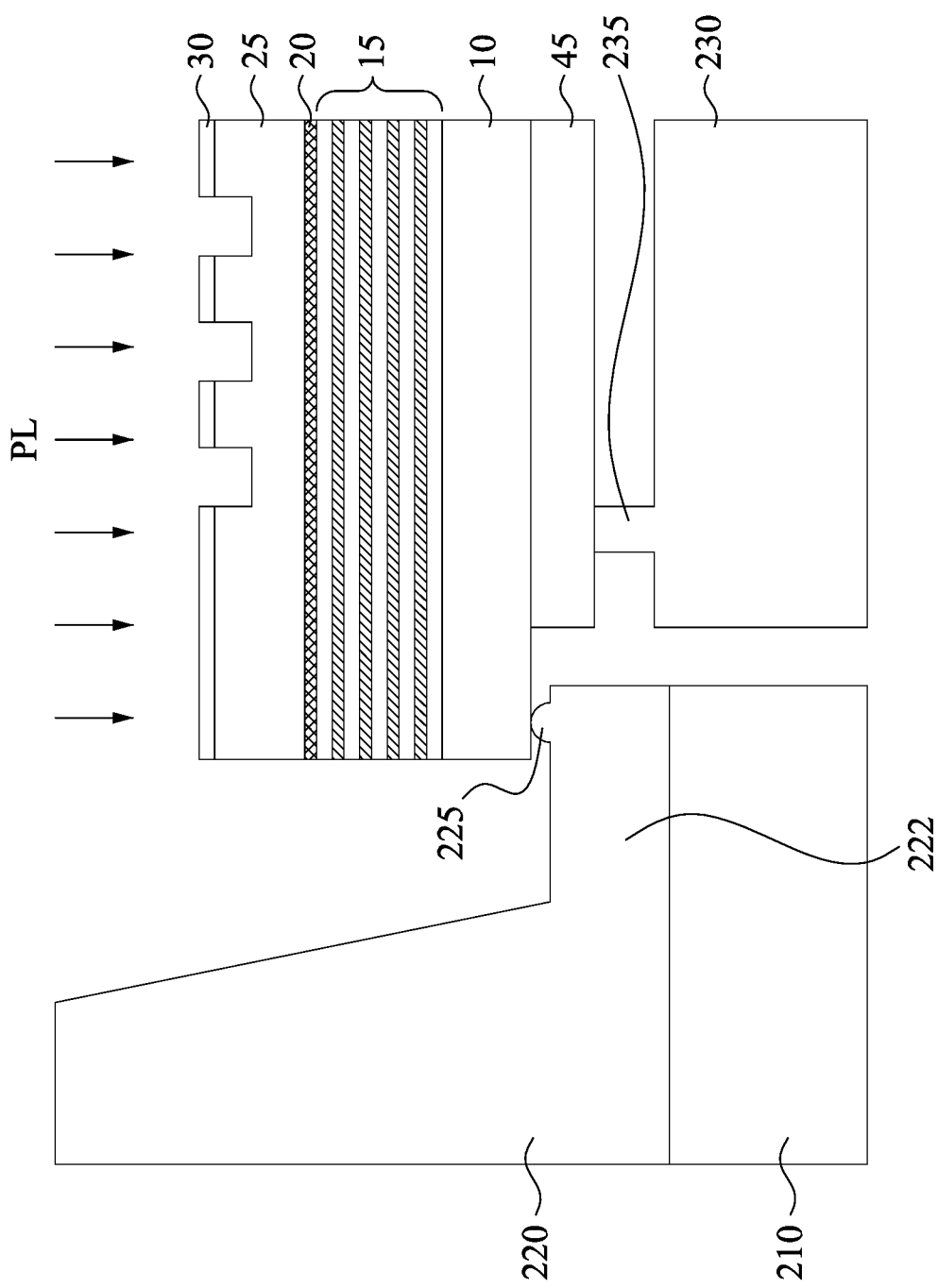
FIG. 5 shows a schematic view of an etching operation of an EUV photo mask according to another embodiment of the present disclosure.

FIG. 5 shows a schematic view of an etching operation of an EUV photo mask according to one embodiment of the present disclosure, to prevent the active species of the plasma from entering the bottom portion of the EUV photo mask during plasma etching.

In some embodiments, the flat portion 225 of the capture ring 220 of the stage 200 has a protrusion 225, such that when an EUV photo mask 5 is placed on the burls 235 of the cathode 230 of the electric chuck mechanism, the bottom surface of the substrate 10 is in contact with the protrusion 225 of the capture ring 220, as shown in FIG. 5. In some embodiments, there is a small gap between the bottom surface of the substrate 10 and the protrusion 225. In certain embodiments, the gap is in a range from about 0 mm to about 0.1 mm.

The protrusion 225 is a line shape pattern and formed along the entire circumference of the flat portion 222 in some embodiments. In other embodiments, multiple protrusions 225 are discretely provided along the circumference of the flat portion 222. A protruding amount of the protrusion 225 is in a range from about 0.1 mm to about 1.0 mm in some embodiments. When the protrusion 225 is used, it is possible to minimize the contact area of the flat portion 222 of the capture ring 220 to the bottom surface of the substrate 10 of the EUV photo mask 5 when the substrate 10 of the EUV photo mask 5 is in contact with the flat portion 222. In other embodiments, there is a gap between the protrusion 225 and the bottom surface of the substrate 10 of the EUV photo mask 5. In certain embodiments, the gap is in a range from about 0 mm to about 0.1 mm. By using the protrusion 225 on the flat portion 222 of the stage 200, it is possible to prevent active species of plasma PL from entering the back portion of the EUV photo mask 5 during the plasma etching. Thus, it is possible to prevent damage on the backside conductive layer 45.

Figure 6:
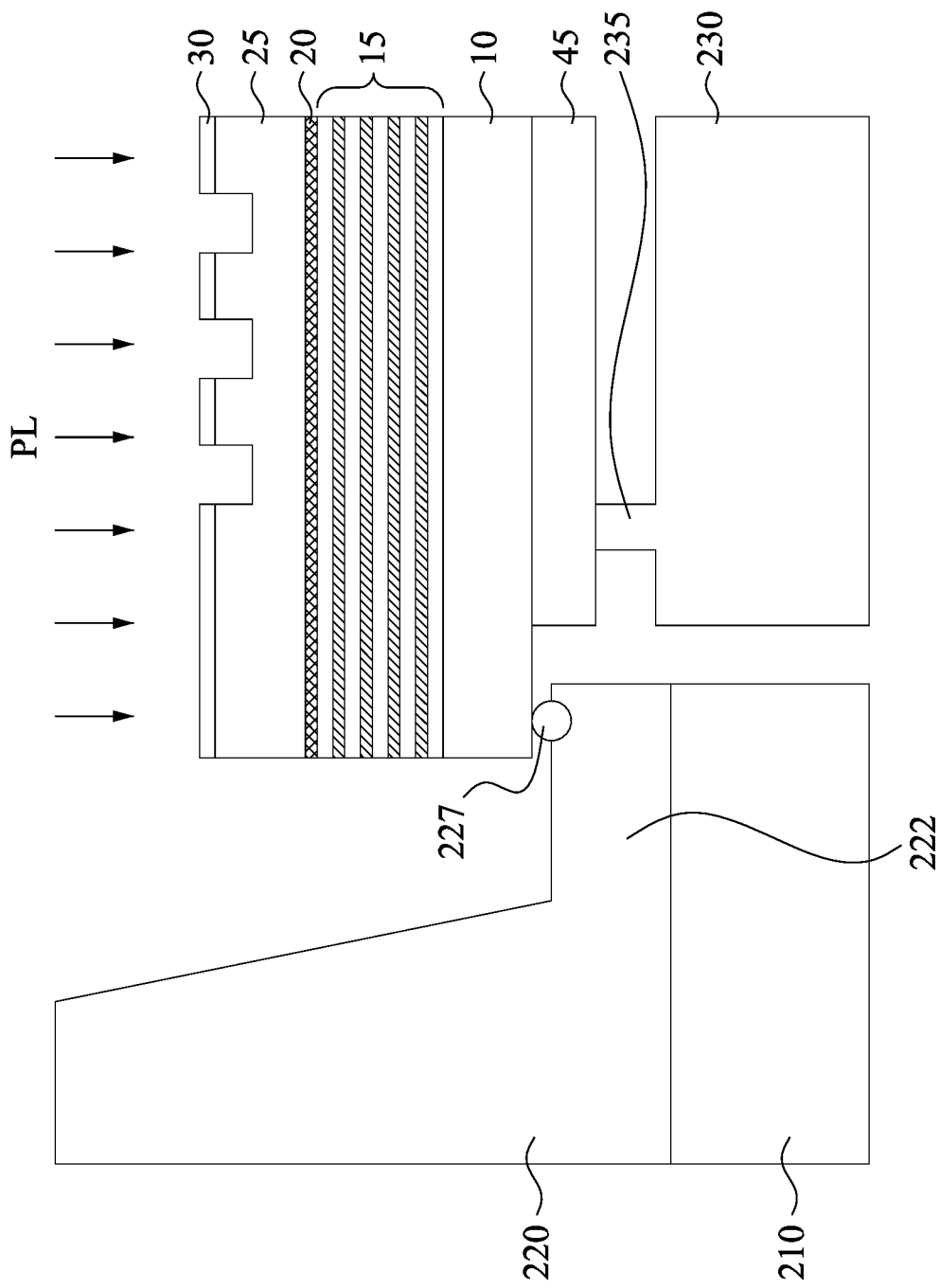
FIG. 6 shows a schematic view of an etching operation of an EUV photo mask according to another embodiment of the present disclosure.

FIG. 6 shows a schematic view of an etching operation of an EUV photo mask according to one embodiment of the present disclosure, to prevent the active species of the plasma from entering the bottom portion of the EUV photo mask during plasma etching.

In this embodiment, instead of a protrusion 225 shown in FIG. 5, an O-ring 227 embedded in a groove formed on the flat portion 222 of the capture ring 220 of the stage 200 is used to be in contact with the bottom surface of the substrate 10 of the EUV photo mask 5. The O-ring 227 is made of a flexible material, for example, but not limited to, rubber (e.g., butadiene rubber, butyl rubber, ethylene propylene diene monomer rubber, or nitrile rubber), polytetrafluoroethylene (PTFE), perfluoroelastomer, or silicone. Similar to the line shaped protrusion 225, the use of the O-ring 227 can minimize the contact area of the flat portion 222 of the stage 200 to the bottom surface of the substrate 10 of the EUV photo mask 5. The diameter of the O-ring is in a range from about 1 mm to 5 mm in some embodiments. By using the O-ring 227 on the flat portion 222 of the stage 200, it is possible to prevent active species of plasma PL from entering the back portion of the EUV photo mask 5 during the plasma etching. Thus, it is possible to prevent damage on the backside conductive layer 45.

Figure 7:
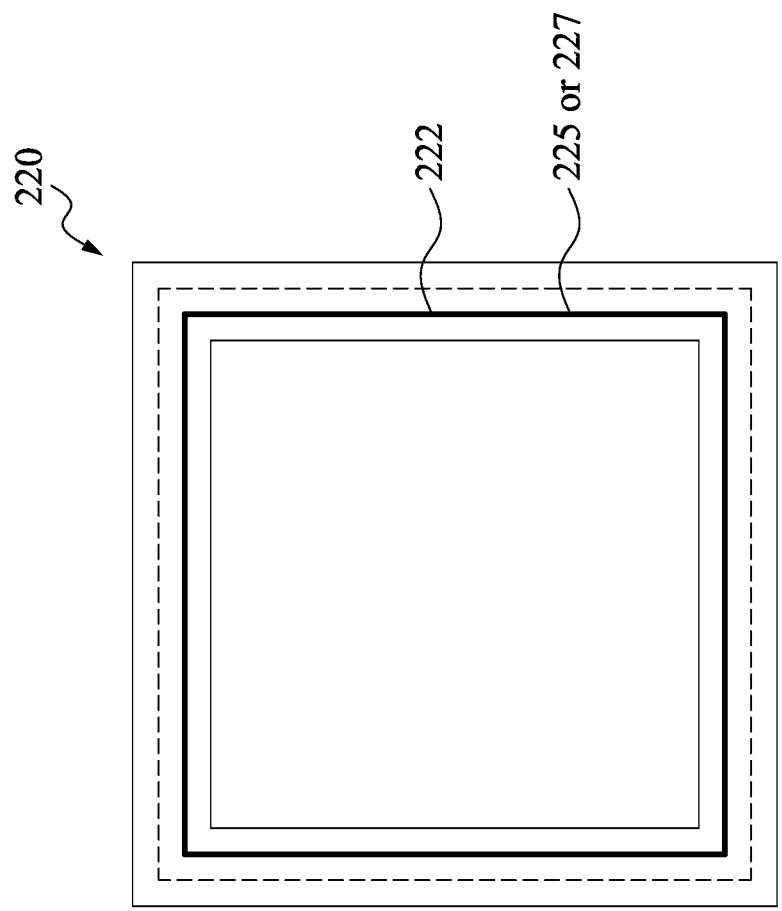
FIG. 7 shows a line-shape protrusion or a line-shaped O-ring according to embodiments of the present disclosure.

FIG. 7 is a plan view of the stage showing a line-shape protrusion 225 or a line-shaped O-ring 227 according to embodiments of the present disclosure.

Figure 8:
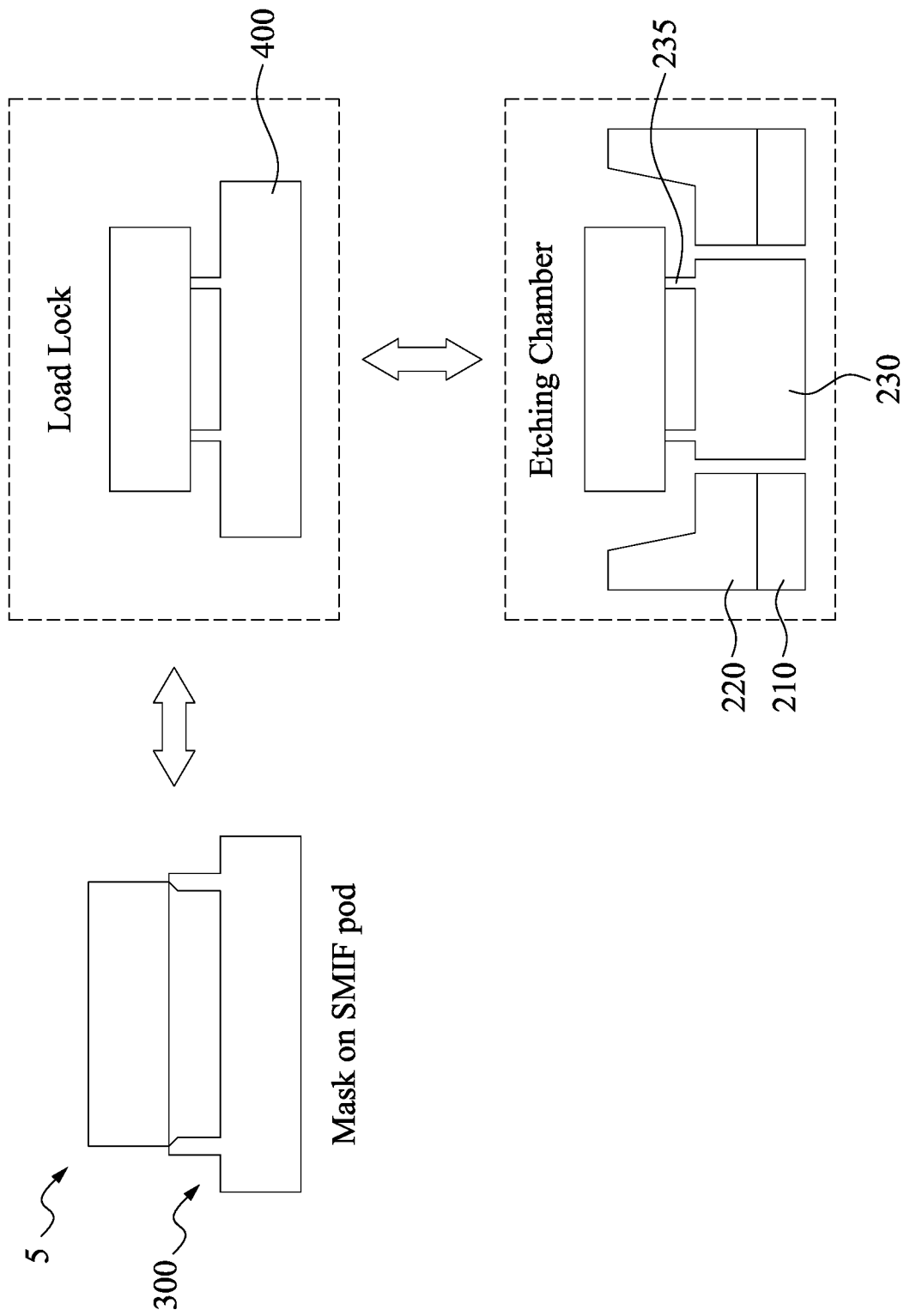
FIG. 8 shows operations of loading an EUV photo mask to be etched into an etching chamber through a load lock chamber.

FIG. 8 shows operations of loading an EUV photo mask 5 to be etched into an etching chamber through a load lock chamber. In some embodiments, an EUV photo mask 5 to be subjected to a plasma etching is stored in a SMIF (Standard Mechanical Interface) pod and carried by the SMIF pod to an etching apparatus. The EUV photo mask 5 is transferred from the SMIF pod to a load lock chamber of the etching apparatus. Then, the EUV photo mask 5 is transferred from the load lock chamber to an etching chamber, as shown in FIG. 8. In the etching chamber, the EUV photo mask 5 is placed on burls 235 of a cathode 230 of an electric chuck. After the etching operation is completed, the EUV photo mask 5 is transferred from the etching chamber to the load lock chamber, and then unloaded from the load lock chamber to the SMIF pod to the next operation, such as cleaning.

It will be understood that not all advantages have been necessarily discussed herein, no particular advantage is required for all embodiments or examples, and other embodiments or examples may offer different advantages.

For example, by using a TaB backside conductive layer, it is possible to obtain a higher electrical and mechanical properties which are suitable for an electric chucking mechanism. In addition, by adjusting the size (area) of the backside conductive layer, it is possible to prevent or suppress damage on the backside conductive layer caused by active species of plasma during the plasma etching. Further, by contacting or closely positioning the bottom surface of the substrate to the flat portion of the capture ring of the stage, it is possible to prevent active species of plasma from entering the back portion of the EUV photo mask during the plasma etching. Thus, it is possible to prevent damage on the backside conductive layer and to prevent generation of particles or unsecure chucking to the electric substrate chucking mechanism.

According to one aspect of the present application, a photo mask for extreme ultra violet (EUV) lithography includes a substrate having a front surface and a back surface opposite to the front surface, a multilayer Mo/Si stack disposed on the front surface of the substrate, a capping layer disposed on the multilayer Mo/Si stack, an absorber layer disposed on the capping layer, and a backside conductive layer disposed on the back surface of the substrate. The backside conductive layer is made of tantalum boride. In one or more of the foregoing and following embodiments, a thickness of the backside conductive layer is in a range from 50 nm to 400 nm. In one or more of the foregoing and following embodiments, a thickness of the backside conductive layer is in a range from 50 nm to 100 nm. In one or more of the foregoing and following embodiments, sheet resistance of the backside conductive layer is equal to or smaller than 20Ω/□. In one or more of the foregoing and following embodiments, surface roughness Ra of the backside conductive layer is equal to or smaller than 0.25 nm. In one or more of the foregoing and following embodiments, flatness of the backside conductive layer is equal to or less than 50 nm. In one or more of the foregoing and following embodiments, the backside conductive layer has a rectangular shape having a first side and a second size crossing the first side, and a length LX of the first side and a length LY of the second side satisfy 142 mm<LX<150 mm and 142 mm<LY<150 mm. In one or more of the foregoing and following embodiments, 144 mm<LX<148 mm and 144 mm<LY<148 mm. In one or more of the foregoing and following embodiments, 0.98≤LX/LY≤1.02. In one or more of the foregoing and following embodiments, the photo mask further includes a hard mask layer disposed on the absorber layer.

In accordance with another aspect of the present disclosure, a photo mask for extreme ultra violet (EUV) lithography includes a substrate having a front surface and a back surface opposite to the front surface, a multilayer Mo/Si stack disposed on the front surface of the substrate, a capping layer disposed on the multilayer Mo/Si stack, an absorber layer disposed on the capping layer, and a backside conductive layer disposed on the back surface of the substrate. The backside conductive layer has a rectangular shape having a first side and a second size crossing the first side, and a length LX of the first side and a length LY of the second side satisfy 142 mm<LX<150 mm and 142 mm<LY<150 mm. In one or more of the foregoing and following embodiments, 144 mm<LX<148 mm and 144 mm<LY<148 mm. In one or more of the foregoing and following embodiments, 0.98≤LX/LY≤1.02. In one or more of the foregoing and following embodiments, the photo mask further includes a hard mask layer disposed on the absorber layer.

In accordance with another aspect of the present disclosure, in a method of manufacturing a photo mask for extreme ultra violet (EUV) lithography, a multilayer Mo/Si stack is formed on a front surface of the substrate. A capping layer is formed on the multilayer Mo/Si stack. An absorber layer is formed on the capping layer. A backside conductive layer is formed on a back surface of the substrate opposite to the front surface. The backside conductive layer is made of tantalum boride. In one or more of the foregoing and following embodiments, a thickness of the backside conductive layer is in a range from 50 nm to 400 nm. In one or more of the foregoing and following embodiments, a thickness of the backside conductive layer is in a range from 50 nm to 100 nm. In one or more of the foregoing and following embodiments, sheet resistance of the backside conductive layer is equal to or smaller than 20Ω/□. In one or more of the foregoing and following embodiments, surface roughness Ra of the backside conductive layer is equal to or smaller than 0.25 nm. In one or more of the foregoing and following embodiments, flatness of the backside conductive layer is equal to or less than 50 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photo mask for extreme ultra violet (EUV) lithography, comprising:
   a substrate having a front surface and a back surface opposite to the front surface;
   a multilayer Mo/Si stack disposed on the front surface of the substrate;
   a capping layer disposed on the multilayer Mo/Si stack;
   an absorber layer disposed on the capping layer; and
   a backside conductive layer disposed on the back surface of the substrate,
   wherein the backside conductive layer is made of tantalum boride, which is crystalline.

2. The photo mask of claim 1, wherein a thickness of the backside conductive layer is in a range from 50 nm to 400 nm.

3. The photo mask of claim 1, wherein a thickness of the backside conductive layer is in a range from 50 nm to 100 nm.

4. The photo mask of claim 1, wherein sheet resistance of the backside conductive layer is equal to or smaller than 20Ω/□.

5. The photo mask of claim 1, wherein, surface roughness Ra of the backside conductive layer is equal to or smaller than 0.25 nm.

6. The photo mask of claim 1, wherein flatness of the backside conductive layer is equal to or less than 50 nm.

7. The photo mask of claim 1, wherein:
   the backside conductive layer has a rectangular shape having a first side and a second size crossing the first side, and
   a length LX of the first side and a length LY of the second side satisfy 142 mm<LX<150 mm and 142 mm<LY<150 mm.

8. The photo mask of claim 7, wherein 144 mm<LX<148 mm and 144 mm<LY<148 mm.

9. The photo mask of claim 7, wherein 0.98≤LX/LY≤1.02.

10. The photo mask of claim 1, further comprising a hard mask layer disposed on the absorber layer.

11. A photo mask for extreme ultra violet (EUV) lithography, comprising:
    a substrate having a front surface and a back surface opposite to the front surface;
    a multilayer Mo/Si stack disposed on the front surface of the substrate;
    a capping layer disposed on the multilayer Mo/Si stack;
    an absorber layer disposed on the capping layer; and
    a backside conductive layer disposed on the back surface of the substrate, wherein
    the backside conductive layer has a rectangular shape having a first side and a second size crossing the first side,
    a length LX of the first side and a length LY of the second side satisfy 142 mm<LX<150 min and 142 mm<LY<150 mm, and
    the backside conductive layer is made of tantalum boride, which is crystalline.

12. The photo mask of claim 11, wherein 144 mm<LX<148 mm and 144 mm<LY<148 mm.

13. The photo mask of claim 11, wherein 0.98≤LX/LY≤1.02.

14. The photo mask of claim 11, further comprising a hard mask layer disposed on the absorber layer.

15. A method of manufacturing a photo mask for extreme ultra violet (EUV) lithography, the method comprising:
    forming a multilayer Mo/Si stack on a front surface of a substrate;
    forming a capping layer on the multilayer Mo/Si stack;
    forming an absorber layer on the capping layer; and
    forming a backside conductive layer on a back surface of the substrate opposite to the front surface,
    wherein the backside conductive layer is made of tantalum boride, which is crystalline.

16. The method of claim 15, wherein a thickness of the backside conductive layer is in a range from 50 nm to 400 nm.

17. The method of claim 15, wherein a thickness of the backside conductive layer is in a range from 50 nm to 100 nm.

18. The method of claim 15, wherein sheet resistance of the backside conductive layer is equal to or smaller than 20Ω/□.

19. The method of claim 15, wherein surface roughness Ra of the backside conductive layer is equal to or smaller than 0.25 nm.

20. The method of claim 15, wherein flatness of the backside conductive layer is equal to or less than 50 nm.

* * * * *